United States Patent
Yoon

(10) Patent No.: US 9,502,384 B2
(45) Date of Patent: Nov. 22, 2016

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: Young Jun Yoon, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 121 days.

(21) Appl. No.: 14/595,698

(22) Filed: Jan. 13, 2015

(65) Prior Publication Data

US 2016/0086920 A1     Mar. 24, 2016

(30) Foreign Application Priority Data

Sep. 22, 2014  (KR) .................. 10-2014-0126000

(51) Int. Cl.
  *G01R 31/02*  (2006.01)
  *G01R 31/26*  (2014.01)
  *H01L 25/065* (2006.01)

(52) U.S. Cl.
  CPC ... *H01L 25/0657* (2013.01); *H01L 2924/0002* (2013.01)

(58) Field of Classification Search
  CPC .............. G01R 31/26; G01R 31/2642; G01R 31/2648; G01R 31/2831; G01R 31/317; G01R 1/0491; G01R 31/265; G01R 31/3012; G01R 31/318511; G01R 31/3004; G01R 31/318513; G01R 31/31924; G01R 33/0047; H01L 2933/0033; H01L 33/48
  USPC ............ 324/762.01, 762.02, 762.03, 762.05, 324/762.06
  See application file for complete search history.

(56) References Cited

U.S. PATENT DOCUMENTS

| | | | | | |
|---|---|---|---|---|---|
| 5,202,853 | A | * | 4/1993 | Choi ................. | G11C 29/34 365/189.04 |
| 5,537,351 | A | * | 7/1996 | Suwa ................. | G11C 7/1006 365/189.02 |
| 5,815,511 | A | * | 9/1998 | Yamamoto ....... | G01R 31/31701 714/43 |
| 6,317,373 | B1 | * | 11/2001 | Tanimura .......... | G11C 29/14 365/191 |
| 6,356,096 | B2 | * | 3/2002 | Takagi ............. | G01R 31/31937 324/756.07 |
| 6,496,429 | B2 | * | 12/2002 | Murai ............... | G11C 29/1201 365/200 |
| 6,507,117 | B1 | * | 1/2003 | Hikita .............. | H01L 23/49575 257/778 |
| 6,539,511 | B1 | * | 3/2003 | Hashizume ....... | G01R 31/3004 714/726 |
| 7,135,882 | B2 | * | 11/2006 | Kato ................. | G11C 16/20 324/73.1 |

(Continued)

FOREIGN PATENT DOCUMENTS

| KR | 20120119532 A | * | 10/2012 | ............... G11C 7/02 |
|---|---|---|---|---|
| KR | 1020120119532 A | | 10/2012 | |

*Primary Examiner* — Jermele M Hollington
*Assistant Examiner* — Sean Curtis
(74) *Attorney, Agent, or Firm* — William Park & Associates Ltd.

(57) ABSTRACT

A semiconductor device may include a first input/output (I/O) unit and a second I/O unit. The first I/O unit may include a first input path that receives a signal through a first pad and a first output path and a first I/O controller that output a signal to the first pad. The second I/O unit may include a second input path that receives a signal through a second pad and a second output path and a second I/O controller that output a signal to the second pad.

12 Claims, 8 Drawing Sheets

(56) References Cited

U.S. PATENT DOCUMENTS

| | | | | |
|---|---|---|---|---|
| 7,202,692 B2* | 4/2007 | Miyano | ............ | G01R 31/31723 324/754.03 |
| 7,240,254 B2* | 7/2007 | Ong | .................... | G11C 29/1201 714/718 |
| 7,478,287 B2* | 1/2009 | Funaba | .................... | G11O 5/04 324/750.3 |
| 7,675,773 B2* | 3/2010 | Mori | ........................ | G11C 8/18 365/185.03 |
| 7,793,174 B2* | 9/2010 | Hattori | ................. | G11C 29/028 324/762.06 |
| 7,969,180 B1* | 6/2011 | Jeon | ................. | G01R 31/31713 324/754.01 |
| 8,284,619 B2* | 10/2012 | Nakakubo | ............. | G11C 11/406 365/189.09 |
| 8,289,041 B2* | 10/2012 | Yamane | ............. | G11C 29/1201 324/750.3 |
| 8,488,393 B2* | 7/2013 | Yoon | ........................ | G11C 7/02 365/189.02 |
| 8,498,831 B2* | 7/2013 | Ide | ......................... | G11C 29/02 702/64 |
| 8,749,267 B2* | 6/2014 | Riho | ................. | H03K 19/01852 326/21 |
| 8,953,391 B1* | 2/2015 | Yoon | .................. | G11C 29/1201 365/189.05 |
| 9,058,901 B2* | 6/2015 | Yoon | ................. | G11C 29/12015 |
| 9,336,903 B2* | 5/2016 | Yoon | .................. | G11C 29/1201 |
| 2003/0234661 A1* | 12/2003 | Yamamoto | ............. | G01R 31/04 324/754.03 |
| 2004/0196709 A1* | 10/2004 | Ong | .................... | G11C 29/1201 365/201 |
| 2005/0024977 A1* | 2/2005 | Ong | .................... | G11C 29/1201 365/232 |
| 2005/0156616 A1* | 7/2005 | Morishita | ........ | G01R 31/31701 324/754.03 |
| 2005/0162182 A1* | 7/2005 | Ong | ................. | G01R 31/31813 324/750.3 |
| 2006/0160512 A1* | 7/2006 | Lim | ....................... | H03B 5/366 455/255 |
| 2008/0303494 A1* | 12/2008 | Nakakubo | ............. | G11C 11/406 323/272 |
| 2009/0040850 A1* | 2/2009 | Mori | ........................ | G11C 8/18 365/201 |
| 2009/0167337 A1* | 7/2009 | Yamane | ............. | G11C 29/1201 324/750.3 |
| 2011/0093224 A1* | 4/2011 | Ide | ......................... | G11C 29/02 702/64 |
| 2011/0156731 A1* | 6/2011 | Yoon | ................. | G01R 31/31713 324/750.3 |
| 2011/0156738 A1* | 6/2011 | Jeon | ................... | G01R 31/2884 324/755.01 |
| 2011/0175639 A1* | 7/2011 | Yoko | ........................ | G06F 1/12 324/762.06 |
| 2012/0262196 A1* | 10/2012 | Yokou | .............. | G01R 31/31851 324/750.3 |
| 2012/0269005 A1* | 10/2012 | Yoon | ........................ | G11C 7/02 365/189.05 |
| 2014/0021978 A1* | 1/2014 | Ikeda | ................. | G01R 31/2889 324/762.06 |
| 2014/0347938 A1* | 11/2014 | Yoon | .................. | G11C 29/1201 365/189.02 |
| 2015/0036438 A1* | 2/2015 | Yoon | .................. | G11C 29/1201 365/189.05 |
| 2015/0123132 A1* | 5/2015 | Yoon | ..................... | G11C 29/025 257/48 |
| 2015/0229299 A1* | 8/2015 | Yoon | ................. | H03K 19/01859 327/143 |
| 2015/0234010 A1* | 8/2015 | Kim | ................. | G01R 31/31703 714/735 |
| 2016/0086920 A1* | 3/2016 | Yoon | .................. | H01L 25/0657 327/565 |
| 2016/0179377 A1* | 6/2016 | Yoon | ........................ | G06F 3/061 711/154 |

* cited by examiner

FIG.3

| SCS1 | H | H | H | H |
|---|---|---|---|---|
| SEN<3:1> | '000' | '001' | '100' | '101' |
| MODE | NORMAL | TEST | FIRST | SECOND |
| BST_RXEN<1> | H | L | H | L |
| BST_RXEN<2> | H | L | L | H |
| BST_SFTB | H | L | × | × |
| BST_SCK | ○ | ○ | × | × |
| BST_EN | L | L | H | H |
| BST_OEB<1> | H | × | H | L |
| BST_OEB<2> | H | × | L | H |

SEMICONDUCTOR DEVICES AND SEMICONDUCTOR SYSTEMS INCLUDING THE SAME

CROSS-REFERENCE TO RELATED APPLICATION

The present application claims priority under 35 U.S.C 119(a) to Korean Application No. 10-2014-0126000, filed on Sep. 22, 2014, in the Korean Intellectual Property Office, which is incorporated herein by reference in its entirety as set forth in full.

BACKGROUND

1. Technical Field

Embodiments of the present disclosure generally relate to semiconductor devices and semiconductor systems including the same.

2. Related Art

A system-in-package (SiP) technique and a chip-on-chip (CoC) technique have been widely used as packaging techniques. These packaging techniques relate to putting a large capacity of memory chips and controller chips in a single package. The system-in-package (SiP) technique may use a wire bonding process to electrically connect a plurality of chips to each other. The chip-on-chip (CoC) technique relates to a packaging technique suitable for increasing the memory capacity in a single package and to the improvement of data transmission speeds between the memory chip and the controller chip in a single package. This is because the memory chip and the controller chip in the package communicate with each other through micro-bump pads.

To allow the packages to operate at a high frequency the micro-bump pads have excellent resistance characteristics, excellent inductance characteristics, and excellent parasitic capacitance characteristics. Thus, a data transmission speed may be improved by increasing the number of the micro-bump pads employed in the package. In the chip-on-chip (CoC) package, each of the memory chips and the controller chips may be fabricated to include the micro-bump pads, and the micro-bump pads of the memory chips and the controller chips may be connected to each other to produce a single unified chip including the memory chips and the controller chips.

In semiconductor memory devices, test operations may be executed to verify the functions of the buffers or the drivers through which data are inputted or outputted. When semiconductor packages are fabricated using the chip-on-chip (CoC) technique and are tested, data may be inputted or outputted through the micro-bump pads of the semiconductor packages.

SUMMARY

According to an embodiment, a semiconductor device may include a first input/output (I/O) unit and a second I/O unit. The first I/O unit may include a first input path, a first output path, and a first I/O controller. The first input may receive a signal through a first pad, and the first output path and the first I/O controller output a signal to the first pad. The second I/O unit may include a second input path, a second output path and a second I/O controller. The second input path may receive a signal through a second pad, and the second output path and the second I/O controller output a signal to the second pad. The second I/O controller may receive a first signal through the first input path and output the first signal through the second output path in a first mode, and the first I/O controller may receive a second signal through the second input path and output the second signal through the first output path in a second mode.

According to an embodiment, a semiconductor system may include a controller and a semiconductor device. The controller may output mode set signals, a chip selection signal and an external clock signal. The semiconductor device may include a first pad and a second pad. The semiconductor device may output a signal inputted through the first pad to the second pad through a first input path, a second input/output (I/O) controller and a second output path if the semiconductor device operates in a first mode in response to the mode set signals. In addition, the semiconductor device may output a signal inputted through the second pad to the first pad through a second input path, a first I/O controller and a first output path if the semiconductor device operates in a second mode in response to the mode set signals.

BRIEF DESCRIPTION OF THE DRAWINGS

FIGS. 3 to 6 illustrate a representation of a logic table and logic circuit diagrams to explain various modes performed in the first and second input/output units illustrated in FIG. 2.

DETAILED DESCRIPTION

Embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices providing a test mode and semiconductor systems including the same.

Figure 1:
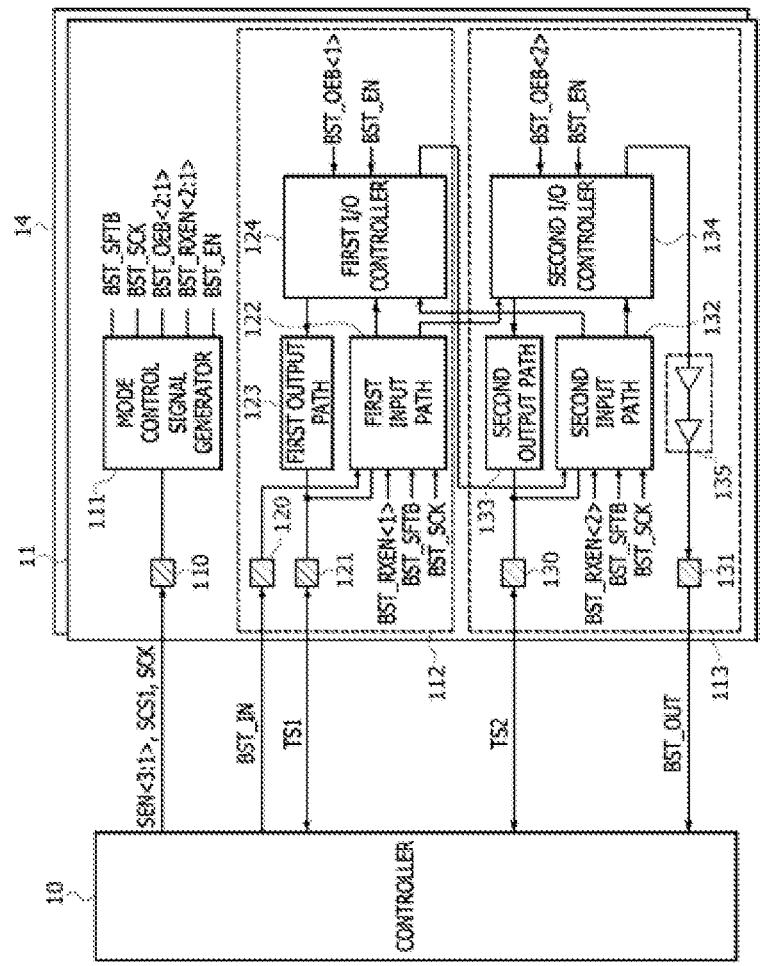
FIG. 1 is a block diagram illustrating a representation of a semiconductor system according to an embodiment.

Referring to FIG. 1, a semiconductor system according to an embodiment may include a controller 10, a first semiconductor device 11 and a second semiconductor device 14. The first semiconductor device 11 may include a mode control signal generator 111, a first input/output (I/O) unit 112 and a second I/O unit 113.

The controller 10 may apply mode set signals SEN<3:1>, a chip selection signal SCS1 and an external clock signal SCK to a pad 110 of the first semiconductor device 11. In a test mode, the controller 10 may apply a test input signal BST_IN to a pad 120 of the first semiconductor device 11 and may receive a test output signal BST_OUT through a pad 131 of the first semiconductor device 11. The controller 10 may transmit or receive a first transmission signal TS1 through a pad 121 of the first semiconductor device 11. The controller 10 may transmit or receive a second transmission signal TS2 through a pad 130 of the first semiconductor device 11. The first semiconductor device 11 may execute a normal mode, a test mode, a first mode or a second mode according to a logic level combination of the mode set signals SEN<3:1>. The chip selection signal SCS1 may be enabled to select the first semiconductor device 11. Another chip selection signal (not shown), which is enabled to select the second semiconductor device 14, may also be outputted from the controller 10 and may be applied to the second semiconductor device 14.

The mode control signal generator 111 may receive the mode set signals SEN<3:1>, the chip selection signal SCS1 and the external clock signal SCK through the pad 110 to generate a first test enablement signal BST_SFTB, a test clock signal BST_SCK, and first and second output selection signals BST_OEB<2:1>. The mode control signal generator 111 may receive the mode set signals SEN<3:1>, the chip selection signal SCS1 and the external clock signal SCK through the pad 110 to generate first and second input selection signals BST_RXEN<2:1>, and a second test enablement signal BST_EN. The first test enablement signal BST_SFTB may be enabled to have a logic "low" level for execution of the test mode. The test clock signal BST_SCK may be generated from the external clock signal SCK when the normal mode or the test mode is executed. The first output selection signal BST_OEB<1> may be enabled to have a logic "low" level when the second mode is executed. The second output selection signal BST_OEB<2> may be enabled to have a logic "low" level when the first mode is executed. The first input selection signal BST_RXEN<1> may be enabled to have a logic "high" level when the first mode is executed. The second input selection signal BST_RXEN<2> may be enabled to have a logic "high" level when the second mode is executed. The second test enablement signal BST_EN may be enabled to have a logic "high" level when the first mode or the second mode is executed.

The first I/O unit 112 may include a first input path 122, a first output path 123 and a first I/O controller 124. The first input path 122 may receive the first transmission signal TS1 through the pad 121. The first transmission signal TS1 may be received in response to the first input path 122 receiving the first input selection signal BST_RXEN<1>, the first test enablement signal BST_SFTB and the test clock signal BST_SCK. The first output path 123 may output an output signal of the first I/O controller 124 as the first transmission signal TS1 through the pad 121. The first I/O controller 124 may receive a signal from the first input path 122 or a second input path 132 and may output a signal to the first output path 123 or the second input path 132, in response to the first output selection signal BST_OEB<1> and the second test enablement signal BST_EN. The first transmission signal TS1 may include at least one selected from the group consisting of a data signal, a command signal, and an address signal.

The second I/O unit 113 may include the second input path 132, a second output path 133, a second I/O controller 134 and a third output path 135. The second input path 132 may receive the second transmission signal TS2 through the pad 130. The second transmission signal TS2 may be received in response to the second input path 132 receiving the second input selection signal BST_RXEN<2>, the first test enablement signal BST_SFTB and the test clock signal BST_SCK. The second output path 133 may output an output signal of the second I/O controller 134 as the second transmission signal TS2 through the pad 130. The second I/O controller 134 may receive a signal from the first input path 122 or the second input path 132 and may output a signal to the second output path 133 or the third output path 135, in response to the second output selection signal BST_OEB<2> and the second test enablement signal BST_EN. The third output path 135 may include drivers that drive signals and may transmit the test output signal BST_OUT to the controller 10 through the pad 131. The second transmission signal TS2 may include at least one selected from the group consisting of a data signal, a command signal and an address signal.

Hereinafter, configurations of the first input path 122, the first output path 123 and the first I/O controller 124 included in the first I/O unit 112 will be described with reference to FIG. 2. Also, configurations of the second input path 132, the second output path 133 and the second I/O controller 134 included in the second I/O unit 113 will be described with reference to FIG. 2.

The first input path 122 may include a first input buffer 211, a first selector 212 and a first latch unit 213. The first input buffer 211 may buffer a signal inputted through the pad 121 to output the buffered signal as a first reception data RX_D1 if, for example, the first input selection signal BST_RXEN<1> enabled to have a logic "high" level is inputted thereto in the first mode. The first selector 212 may select and output a signal inputted through the pad 120 if, for example, the test mode is executed and the first test enablement signal BST_SFTB enabled to have a logic "low" level is inputted thereto. The first selector 212 may select and output an output signal of the first input buffer 211 if, for example, the test mode is not executed and the first test enablement signal BST_SFTB is disabled to have a logic "high" level is inputted thereto. The first latch unit 213 may latch and output an output signal of the first selector 212 in synchronization with the test clock signal BST_SCK. The test clock signal BST_SCK is generated when the test mode is executed. The first output path 123 may include drivers that drive signals and may output the output signals of the first I/O controller 124 through the pad 121. The first reception data RX_D1 may be stored in memory cells of a first channel (not shown).

The first I/O controller 124 may include a second selector 214 and a third selector 215. The second selector 214 may select and output a second reception data RX_D2 outputted from the second input path 132 if, for example, the first mode or the second mode is executed and the second test enablement signal BST_EN enabled to have a logic "high" level is inputted thereto. The second reception data RX_D2 may be stored in memory cells of a second channel (not shown). The second selector 214 may select and output an output signal of the first latch unit 213 if, for example, the first mode and the second mode are not executed and the second test enablement signal BST_EN disabled to have a logic "low" level is inputted thereto. The third selector 215 may select and output an output signal of the second selector 214 if, for example, the second mode is executed and the first output selection signal BST_OEB<1> enabled to have a logic "low" level is inputted thereto. The third selector 215 may select and output a first transmission data TX_D1 outputted from the memory cells of the first channel (not shown) if, for example, the second mode is not executed and the first output selection signal BST_OEB<1> disabled to have a logic "high" level is inputted thereto. The first channel and the second channel may receive the address/command signals through separate pads. In addition, the first channel and the second channel may receive and output the data through separate pads.

The second input path 132 may include a second input buffer 216, a fourth selector 217 and a second latch unit 218. The second input buffer 216 may buffer a signal inputted through the pad 130 to output the buffered signal as the second reception data RX_D2 if, for example, the second input selection signal BST_RXEN<2> enabled to have a logic "high" level is inputted thereto in the second mode. The fourth selector 217 may select and output a signal outputted from the second selector 214 if the test mode is executed and the first test enablement signal BST_SFTB enabled to have a logic "low" level is inputted thereto. The fourth selector 217 may select and output an output signal of the second input buffer 216 if, for example, the test mode is not executed and the first test enablement signal BST_SFTB disabled to have a logic "high" level is inputted thereto. The second latch unit 218 may latch and output an output signal of the fourth selector 217 in synchronization with the test clock signal BST_SCK. The test clock signal BST_SCK is generated when the test mode is executed. The second output path 133 may include drivers that drive signals and may output the output signals of the second I/O controller 134 through the pad 130. The second reception data RX_D2 may be stored in the memory cells of the second channel (not shown).

The second I/O controller 134 may include a fifth selector 219 and a sixth selector 220. The fifth selector 219 may select and output the first reception data RX_D1 outputted from the first input path 122 if, for example, the first mode or the second mode is executed and the second test enablement signal BST_EN enabled to have a logic "high" level is inputted thereto. The first reception data RX_D1 may be stored in the memory cells of the first channel (not shown). The fifth selector 219 may select and output an output signal of the second latch unit 218 if, for example, the first mode and the second mode are not executed and the second test enablement signal BST_EN disabled to have a logic "low" level is inputted thereto. The sixth selector 220 may select and output an output signal of the fifth selector 219 if, for example, the first mode is executed and the second output selection signal BST_OEB<2> enabled to have a logic "low" level is inputted thereto. The sixth selector 220 may select and output a second transmission data TX_D2 outputted from the memory cells of the second channel (not shown) if, for example, the first mode is not executed and the second output selection signal BST_OEB<2> disabled to have a logic "high" level is inputted thereto.

Referring to FIG. 3, while the chip selection signal SCS1 has a logic "high" level (i.e., H) to select the first semiconductor device 11, logic levels of the first and second input selection signals BST_RXEN<2:1>, the first test enablement signal BST_SFTB, the test clock signal BST_SCK, the first and second output selection signals BST_OEB<2:1>, and the second test enablement signal BST_EN may be set to execute the normal mode, the test mode, the first mode or the second mode according to a logic level combination of the mode set signals SEN<3:1>.

If the mode set signals SEN<3:1> has a logic level combination of '000', the normal mode (i.e., NORMAL) may be executed. In order that the normal mode is executed, the first and second input selection signals BST_RXEN<2:1> may be enabled to have a logic "high" level, the first test enablement signal BST_SFTB may be disabled to have a logic "high" level, the test clock signal BST_SCK may be generated, the first and second output selection signals BST_OEB<2:1> may be disabled to have a logic "high" level, and the second test enablement signal BST_EN may be disabled to have a logic "low" level (i.e., L). In the mode set signals SEN<3:1>, the logic level combination of '000' means that all of the mode set signal<3>, the mode set signal SEN<2> and the mode set signal <1> are set to have a logic "low" level. In the normal mode, the data received through the pad 121 may be stored in the memory cells of the first channel as the first reception data RX_D1, or the data stored in the memory cells of the first channel may be outputted through the pad 121 as the first transmission data TX_D1. In addition, in the normal mode, the data received through the pad 130 may be stored in the memory cells of the second channel as the second reception data RX_D2, or the data stored in the memory cells of the second channel may be outputted through the pad 130 as the second transmission data TX_D2. The logic level combination of the mode set signals SEN<3:1> for execution of the normal mode may be set to be different according to the various embodiments.

If the mode set signals SEN<3:1> has a logic level combination of '001', the test mode (i.e., TEST) may be executed. In order that the test mode is executed, the first and second input selection signals BST_RXEN<2:1> may be disabled to have a logic "low" level, the first test enablement signal BST_SFTB may be enabled to have a logic "low" level, the test clock signal BST_SCK may be generated, and the second test enablement signal BST_EN may be disabled to have a logic "low" level. In the test mode, the first and second output selection signals BST_OEB<2:1> may have either a logic "high" level or a logic "low" level. In the mode set signals SEN<3:1>, the logic level combination of '001' means that both of the mode set signal<3> and the mode set signal SEN<2> are set to have a logic "low" level and the mode set signal <1> is set to have a logic "high" level.

If the mode set signals SEN<3:1> has a logic level combination of '100', the first mode (i.e. FIRST) may be executed. In order that the first mode is executed, the first input selection signal BST_RXEN<1> may be enabled to have a logic "high" level, the second input selection signal BST_RXEN<2> may be disabled to have a logic "low" level, the second test enablement signal BST_EN may be enabled to have a logic "high" level, the first output selection signal BST_OEB<1> may be disabled to have a logic "high" level, and the second output selection signal BST_OEB<2> may be enabled to have a logic "low" level. The first mode may be executed regardless of generation of the test clock signal BST_SCK and a logic level of the first test enablement signal BST_SFTB. In the mode set signals SEN<3:1>, the logic level combination of '100' means that the mode set signal<3> is set to have a logic "high" level and both of the mode set signal SEN<2> and the mode set signal <1> are set to have a logic "low" level.

If the mode set signals SEN<3:1> has a logic level combination of '101', the second mode (i.e., SECOND) may be executed. In order that the second mode is executed, the first input selection signal BST_RXEN<1> may be disabled to have a logic "low" level, the second input selection signal BST_RXEN<2> may be enabled to have a logic "high" level, the second test enablement signal BST_EN may be enabled to have a logic "high" level, the first output selection signal BST_OEB<1> may be enabled to have a logic "low" level, and the second output selection signal BST_OEB<2> may be disabled to have a logic "high" level. The second mode may be executed regardless of generation of the test clock signal BST_SCK and a logic level of the first test enablement signal BST_SFTB (i.e. X). In the mode set signals SEN<3:1>, the logic level combination of '101' means that both of the mode set signal<3> and the mode set signal <1> are set to have a logic "high" level and the mode set signal SEN<2> is set to have a logic "low" level.

Figure 4:
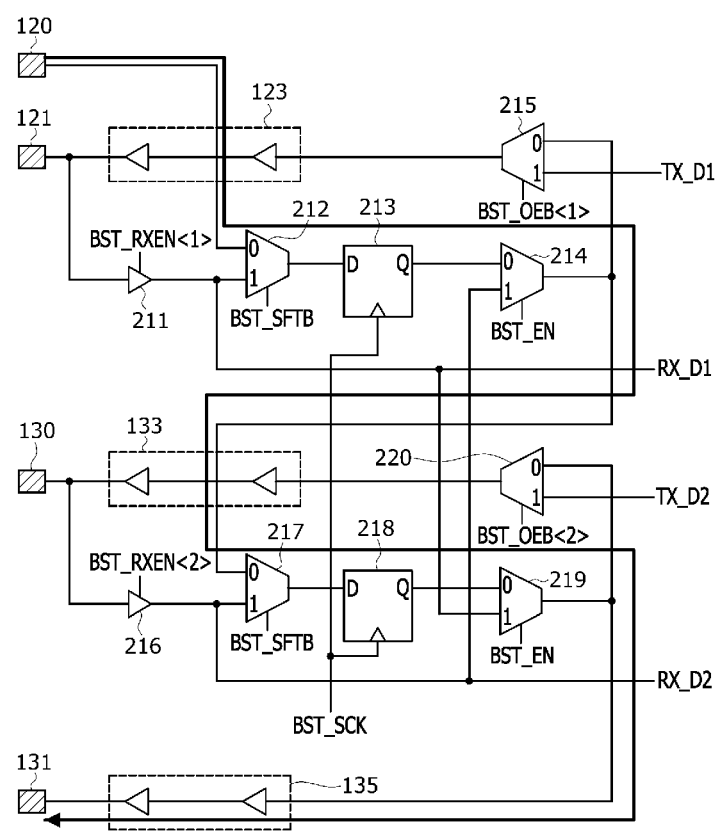

FIG. 4 illustrates an operation of the test mode executed in the semiconductor system according to an embodiment. Referring to FIG. 4, if for example the mode set signals SEN<3:1> having a logic level combination of '001' are applied to the first semiconductor device 11, the first test enablement signal BST_SFTB may be enabled to have a logic "low" level, the test clock signal BST_SCK may be generated, and the second test enablement signal BST_EN may be disabled to have a logic "low" level. Thus, a signal inputted through the pad 120 may be outputted to the pad 131 through the first selector 212, the first latch unit 213, the second selector 214, the fourth selector 217, the second latch unit 218, the fifth selector 219, and the third output path 135 (i.e., see blacked arrow line). If the test mode is executed, a normality/abnormality of interfaces of the first selector 212, the first latch unit 213, the second selector 214, the fourth selector 217, the second latch unit 218, the fifth selector 219, and the third output path 135 may be verified.

Figure 5:
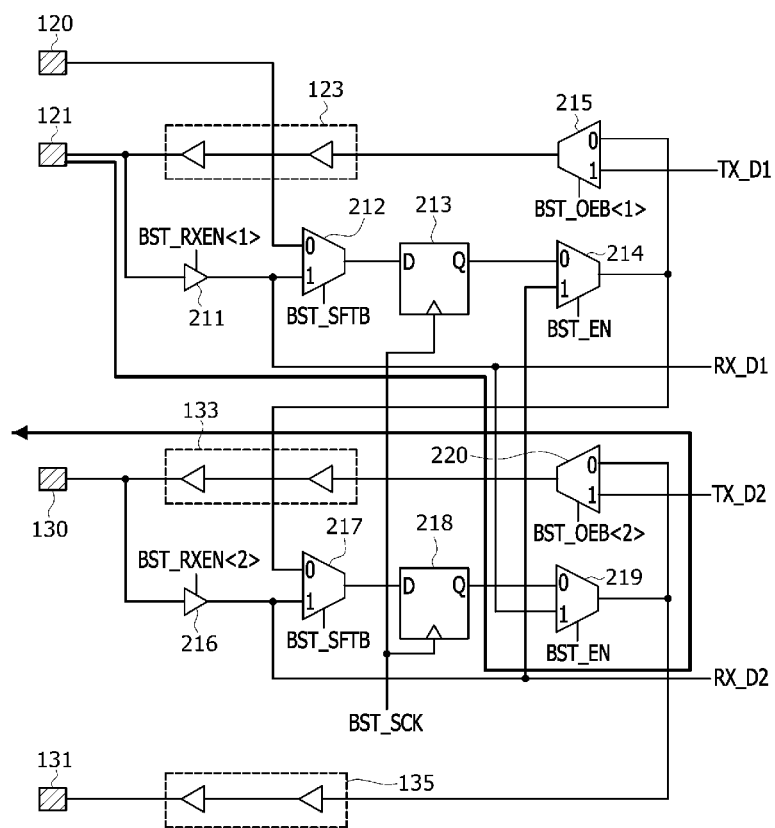

FIG. 5 illustrates an operation of the first mode executed in the semiconductor system according to an embodiment. Referring to FIG. 5, if for example the mode set signals SEN<3:1> having a logic level combination of '100' are applied to the first semiconductor device 11, the first input selection signal BST_RXEN<1> may be enabled to have a logic "high" level, the second test enablement signal BST_EN may be enabled to have a logic "high" level, and the second output selection signal BST_OEB<2> may be enabled to have a logic "low" level. Thus, a signal inputted through the pad 121 may be outputted to the pad 130 through the first input buffer 211, the fifth selector 219, the sixth selector 220, and the second output path 133 (i.e., see blacked arrow line). If the first mode is executed, a normality/abnormality of interfaces of the first input buffer 211, the fifth selector 219, the sixth selector 220, and the second output path 133 may be verified.

Figure 6:
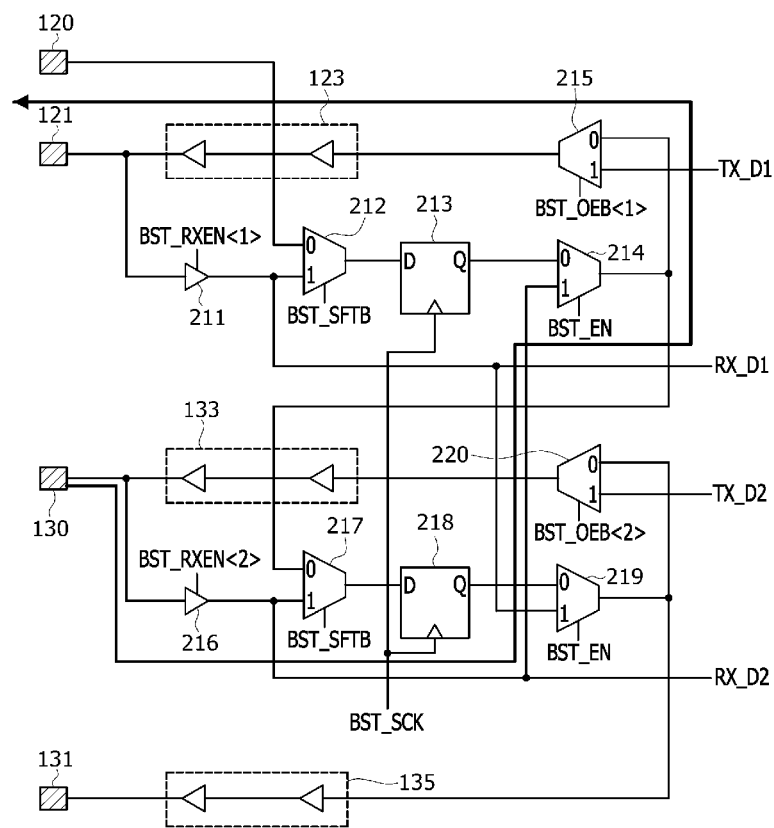

FIG. 6 illustrates an operation of the second mode executed in the semiconductor system according to an embodiment. Referring to FIG. 6, if for example the mode set signals SEN<3:1> having a logic level combination of '101' are applied to the first semiconductor device 11, the second input selection signal BST_RXEN<2> may be enabled to have a logic "high" level, the second test enablement signal BST_EN may be enabled to have a logic "high" level, and the first output selection signal BST_OEB<1> may be enabled to have a logic "low" level. Thus, a signal inputted through the pad 130 may be outputted to the pad 121 through the second input buffer 216, the second selector 214, the third selector 215, and the first output path 123 (i.e., see blacked arrow line). If the second mode is executed, a normality/abnormality of interfaces of the second input buffer 216, the second selector 214, the third selector 215, and the first output path 123 may be verified.

As described above, the semiconductor system according to an embodiment may provide various modes in which signals are transmitted through various I/O paths according to logic level combinations of the mode set signals SEN<3:1>. Thus, a normality/abnormality of an interface to an arbitrary signal pattern may be readily verified. For example, a normality/abnormality of interfaces of the first selector 212, the first latch unit 213, the second selector 214, the fourth selector 217, the second latch unit 218, the fifth selector 219, and the third output path 135 can be verified in the test mode. Additionally, a normality/abnormality of interfaces of the first input buffer 211, the fifth selector 219, the sixth selector 220, and the second output path 133 can be verified in the first mode. Also, a normality/abnormality of interfaces of the second input buffer 216, the second selector 214, the third selector 215, and the first output path 123 can be verified in the second mode.

Figure 7:
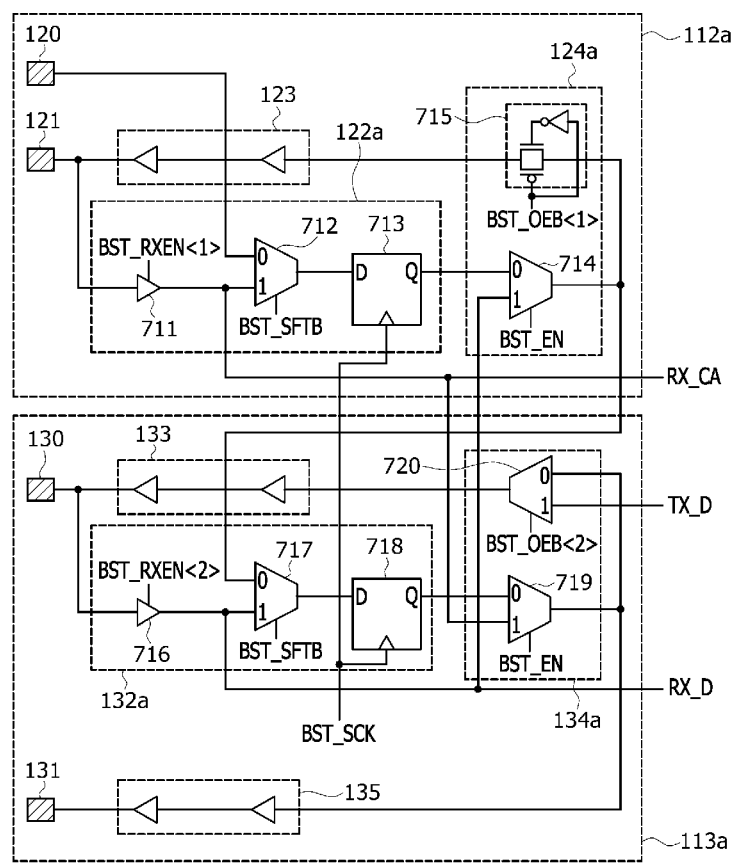
FIG. 7 is a logic circuit diagram illustrating a representation of an example of a first input/output unit and an example of a second input/output unit that may be included in the semiconductor system of FIG. 1.

Hereinafter, configurations of a first I/O unit 112a and a second I/O unit 113a included in a semiconductor system according to an embodiment will be described more fully with reference to FIG. 7. The first I/O unit 112a may include a first input path 122a, the first output path 123 and a first I/O controller 124a. The second I/O unit 113a may include a second input path 132a, the second output path 133, a second I/O controller 134a and the third output path 135. In FIG. 7, the same reference numerals or the same reference designators as used in FIG. 2 denote the same elements.

The first input path 122a may include a first input buffer 711, a first selector 712 and a first latch unit 713. The first input buffer 711 may buffer a signal inputted through the pad 121 to output the buffered signal as a command/address signal RX_CA if, for example, the first input selection signal BST_RXEN<1> enabled to have a logic "high" level is inputted thereto in the first mode. The first selector 712 may select and output a signal inputted through the pad 120 if, for example, the test mode is executed and the first test enablement signal BST_SFTB enabled to have a logic "low" level is inputted thereto. The first selector 712 may select and output an output signal of the first input buffer 711 if, for example, the test mode is not executed and the first test enablement signal BST_SFTB disabled to have a logic "high" level is inputted thereto. The first latch unit 713 may latch and output an output signal of the first selector 712 in synchronization with the test clock signal BST_SCK is generated. The test clock signal BST_SCK may be generated when the test mode is executed. The command/address signal RX_CA may include a command and an address for operating the memory cells of the first channel (not shown). Alternatively, data instead of the command/address signal RX_CA may be outputted from the first input buffer 711 according to the various embodiments.

The first I/O controller 124a may include a second selector 714 and a first transfer gate 715. The second selector 714 may select and output a reception data RX_D outputted from a second input path 132a if, for example, the first mode or the second mode is executed and the second test enablement signal BST_EN enabled to have a logic "high" level is inputted thereto. The second selector 714 may select and output an output signal of the first latch unit 713 if, for example, the first mode and the second mode are not executed and the second test enablement signal BST_EN disabled to have a logic "low" level is inputted thereto. The first transfer gate 715 may be turned on to transmit an output signal of the second selector 714 to the first output path 123.

The second input path 132a may include a second input buffer 716, a third selector 717 and a second latch unit 718. The second input buffer 716 may buffer a signal inputted through the pad 130 to output the buffered signal as the reception data RX_D if, for example, the second input selection signal BST_RXEN<2> enabled to have a logic "high" level is inputted thereto in the second mode. The third selector 717 may select and output a signal outputted from the second selector 714 if, for example, the test mode is executed and the first test enablement signal BST_SFTB enabled to have a logic "low" level is inputted thereto. The third selector 717 may select and output an output signal of the second input buffer 716 if, for example, the test mode is not executed and the first test enablement signal BST_SFTB disabled to have a logic "high" level is inputted thereto. The second latch unit 718 may latch and output an output signal of the third selector 717 in synchronization with the test clock signal BST_SCK. The test clock signal BST_SCK may be generated when the test mode is executed. The reception data RX_D may be stored in the memory cells of the second channel (not shown).

The second I/O controller 134*a* may include a fourth selector 719 and a fifth selector 720. The fourth selector 719 may select and output the command/address signal RX_CA outputted from the first input path 122*a* if, for example, the first mode or the second mode is executed and the second test enablement signal BST_EN enabled to have a logic "high" level is inputted thereto. The fourth selector 719 may select and output an output signal of the second latch unit 718 if, for example, the first mode and the second mode are not executed and the second test enablement signal BST_EN disabled to have a logic "low" level is inputted thereto. The fifth selector 720 may select and output an output signal of the fourth selector 719 if, for example, the first mode is executed and the second output selection signal BST_OEB<2> enabled to have a logic "low" level is inputted thereto. The fifth selector 720 may select and output a transmission data TX_D outputted from the memory cells of the second channel (not shown) if, for example, the first mode is not executed and the second output selection signal BST_OEB<2> disabled to have a logic "high" level is inputted thereto.

Figure 2:
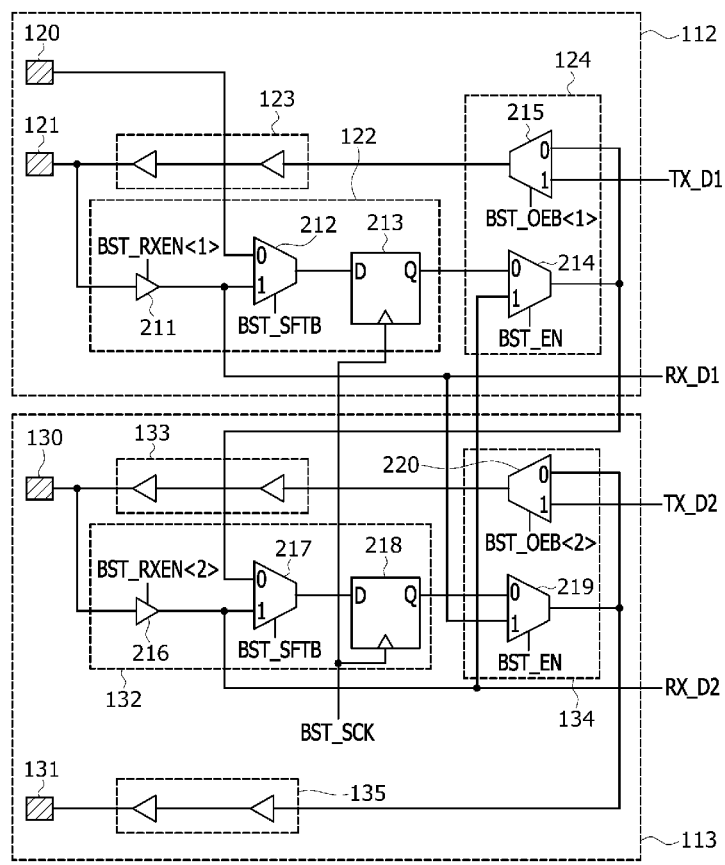
FIG. 2 is a logic circuit diagram illustrating representations of an example of a first input/output unit and an example of a second input/output unit that are included in the semiconductor system of FIG. 1.

The first I/O unit 112*a* illustrated in FIG. 7 may have substantially the same configuration as the first I/O unit 112 illustrated in FIG. 2 except that the first transfer gate 715 instead of the third selector 215 is included in the first I/O controller 124*a* and the command/address signal RX_CA instead of the first reception data RX_D1 is inputted through the first input path 122*a*. Thus, a detailed description and operation of the first I/O unit 112*a* illustrated in FIG. 7 will be omitted.

As described above, a semiconductor system according to any one of the embodiments may provide various modes in which signals are transmitted through various I/O paths. Thus, a normality/abnormality of an interface to an arbitrary signal pattern may be readily verified.

Figure 8:
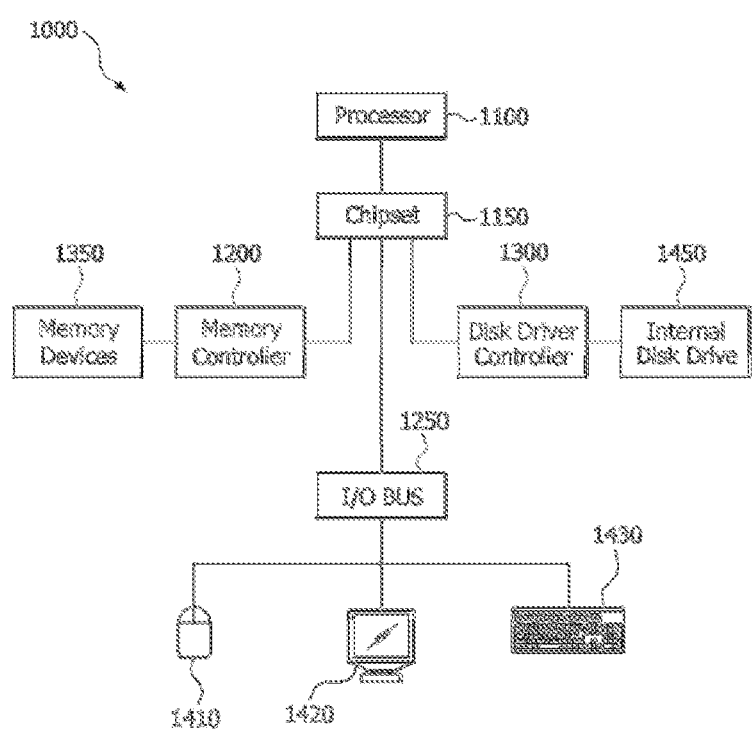
FIG. 8 illustrates a block diagram of an example of a representation of a system employing the semiconductor devices and/or semiconductor systems in accordance with the embodiments discussed above with relation to FIGS. 1-7.

The semiconductor devices and/or semiconductor systems discussed above (see FIGS. 1-7) are particular useful in the design of memory devices, processors, and computer systems. For example, referring to FIG. 8, a block diagram of a system employing the semiconductor devices and/or semiconductor systems in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor device and/or semiconductor system as discussed above with reference to FIGS. 1-7. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and/or semiconductor system as discussed above with relation to FIGS. 1-7, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 8 is merely one example of a system employing the semiconductor devices and/or semiconductor systems as discussed above with relation to FIGS. 1-7. In alternate embodiments, such as cellular phones or digital cameras, the components may differ from the embodiments illustrated in FIG. 8.

What is claimed is:

1. A semiconductor device comprising:
   a first input/output (I/O) unit including a first input path that receives a signal through a first pad and a first output path and a first I/O controller that output a signal to the first pad; and
   a second I/O unit including a second input path that receives a signal through a second pad and a second output path and a second I/O controller that output a signal to the second pad,
   wherein the second I/O controller receives a first signal through the first input path and outputs the first signal through the second output path in a first mode, and the first I/O controller receives a second signal through the second input path and outputs the second signal through the first output path in a second mode.

2. The semiconductor device of claim 1, wherein the first input path includes a first input buffer suitable for buffering a signal inputted through the first pad in response to a first input selection signal, and
   wherein the first input selection signal is enabled in the first mode.

3. The semiconductor device of claim 2, wherein the first I/O unit further includes:
a third pad coupled to the first input path,
wherein the first input path includes:
a first selector suitable for selectively outputting an output signal of the first input buffer or a signal inputted through the third pad in response to a first test enablement signal; and
a first latch unit suitable for latching and outputting an output signal of the first selector in synchronization with a test clock signal.

4. The semiconductor device of claim 2, wherein the first I/O controller includes:
a second selector suitable for selectively outputting an output signal of the first input path or the second input path in response to a second test enablement signal, the second test enablement signal enabled in the first mode or the second mode; and
a third selector suitable for selectively outputting an output signal of the second selector or a first transmission signal to the first output path in response to a first output selection signal, the first output selection signal enabled in the second mode.

5. The semiconductor device of claim 1, wherein the second input path includes a second input buffer suitable for buffering a signal inputted through the second pad in response to a second input selection signal, and
wherein the second input selection signal is enabled in the second mode.

6. The semiconductor device of claim 5, wherein the second input path includes:
a fourth selector suitable for selectively outputting an output signal of the second input buffer or an output signal of the first I/O controller in response to a second test enablement signal; and
a second latch unit suitable for latching and outputting an output signal of the fourth selector in synchronization with a test clock signal.

7. The semiconductor device of claim 5, wherein the second I/O controller includes:
a fifth selector suitable for selectively outputting an output signal of the first input path or the second input path in response to a second test enablement signal, the second test enablement signal enabled in the first mode or the second mode; and
a sixth selector suitable for selectively outputting an output signal of the fifth selector or a second transmission signal to the second output path in response to a second output selection signal, the second output selection signal enabled in the first mode.

8. The semiconductor device of claim 7, wherein the second I/O unit includes:
a fourth pad;
a third output path including at least one driver coupled to the fourth pad and suitable for outputting data outputted from the fifth selector to the fourth pad.

9. The semiconductor device of claim 1, further comprising:
a mode control signal generator suitable to receive a mode set signal and a chip selection signal, and suitable for generating a first input selection signal, a second input selection signal, a first output selection signal and a second output selection signal,
wherein at least one of the first input selection signal, the second input selection signal, the first output selection signal and the second output selection signal is enabled or disabled according to a logic level combination of the mode set signal while a chip selection signal is enabled.

10. The semiconductor device of claim 9,
wherein the first input selection signal and the second output selection signal are enabled in the first mode; and
wherein the second input selection signal and the first output selection signal are enabled in the second mode.

11. The semiconductor device of claim 9,
wherein the first I/O unit includes a third pad coupled to the first input path,
wherein the second I/O unit includes:
a fourth pad; and
a third output path coupled to the fourth pad and the second I/O controller,
wherein the mode control signal generator is suitable for generating a first test enablement signal,
wherein the first test enablement signal is enabled to execute a test mode, and
wherein if the test mode is executed, a signal inputted through the third pad is outputted to the fourth pad through the first input path, the first I/O controller, the second input path, the second I/O controller and the third output path.

12. The semiconductor device of claim 11,
wherein the mode control signal generator is suitable for generating a test clock signal from an external clock signal in the test mode and is suitable for generating a second test enablement signal, and
wherein the second test enablement signal is enabled in the first mode or the second mode.

* * * * *